United States Patent
Shimonishi et al.

(10) Patent No.: US 8,852,970 B2
(45) Date of Patent: Oct. 7, 2014

(54) METHOD FOR MOUNTING LUMINESCENT DEVICE

(75) Inventors: Shota Shimonishi, Kiyosu (JP); Hiroyuki Tajima, Kiyosu (JP); Yosuke Tsuchiya, Kiyosu (JP)

(73) Assignee: Toyoda Gosei Co., Ltd., Kiyosu-Shi, Aichi-Ken (TW)

( * ) Notice: Subject to any disclaimer, the term of this patent is extended or adjusted under 35 U.S.C. 154(b) by 0 days.

(21) Appl. No.: 13/137,855

(22) Filed: Sep. 19, 2011

(65) Prior Publication Data

US 2012/0070920 A1 Mar. 22, 2012

(30) Foreign Application Priority Data

Sep. 21, 2010 (JP) ................................. 2010-210400

(51) Int. Cl.
*H01L 21/00* (2006.01)
*H01L 33/00* (2010.01)
*H01L 23/00* (2006.01)
*H01L 33/46* (2010.01)

(52) U.S. Cl.
CPC ..... *H01L 33/005* (2013.01); *H01L 2224/29344* (2013.01); *H01L 2933/0033* (2013.01); *H01L 2224/73265* (2013.01); *H01L 2924/0132* (2013.01); *H01L 2224/2732* (2013.01); *H01L 2224/83192* (2013.01); *H01L 2224/29339* (2013.01); *H01L 24/743* (2013.01); *H01L 2224/48227* (2013.01); *H01L 2224/81192* (2013.01); *H01L 2224/45144* (2013.01); *H01L 24/11* (2013.01); *H01L 24/29* (2013.01); *H01L 2924/12041* (2013.01); *H01L 24/45* (2013.01); *H01L 2933/0066* (2013.01); *H01L 2224/92247* (2013.01); *H01L 24/83* (2013.01); *H01L 2924/00014* (2013.01); *H01L 24/49* (2013.01); *H01L 2924/01322* (2013.01); *H01L 33/46* (2013.01); *H01L 24/27* (2013.01); *H01L 2224/29347* (2013.01); *H01L 2224/83805* (2013.01); *H01L 2224/1132* (2013.01); *H01L 2224/48091* (2013.01); *H01L 24/48* (2013.01); *H01L 24/81* (2013.01); *H01L 2224/32225* (2013.01); *H01L 2224/49107* (2013.01)
USPC .................. 438/25; 438/29; 257/E21.499

(58) Field of Classification Search
USPC .................. 438/28, 25–27, 29; 257/E21.499, 257/E33.061
See application file for complete search history.

(56) References Cited

U.S. PATENT DOCUMENTS 7,342,179 B2  3/2008  Hashimoto
7,834,371 B2  11/2010 Sano et al.
(Continued)

FOREIGN PATENT DOCUMENTS

JP  2004-247531 (A)  9/2004
JP  2005-072148       3/2005
(Continued)

OTHER PUBLICATIONS

Japanese Notification of Reason for Refusal dated Feb. 6, 2013, with English-language translation.

(Continued)

*Primary Examiner* — Thanhha Pham
(74) *Attorney, Agent, or Firm* — McGinn IP Law Group, PLLC

(57) ABSTRACT

A method for mounting a luminescent device having a mount layer on a substrate, comprising the steps of coating a metallic nano-particle paste on the substrate, disposing the mount layer of the luminescent device on the metallic nano-particle paste, and heating the mount layer and the metallic nano-particle paste to form an alloy, thereby bonding the luminescent device and the substrate.

13 Claims, 4 Drawing Sheets

(56) References Cited

U.S. PATENT DOCUMENTS

| | | |
|---|---|---|
| 7,960,834 B2 | 6/2011 | Funaki |
| 8,043,879 B2 | 10/2011 | Sano et al. |
| 2005/0110161 A1 | 5/2005 | Naito et al. |
| 2007/0183920 A1* | 8/2007 | Lu et al. ............................ 419/9 |
| 2009/0159902 A1* | 6/2009 | Yasuda et al. ................... 257/88 |
| 2010/0233846 A1* | 9/2010 | Ohe et al. ........................ 438/99 |
| 2010/0247783 A1* | 9/2010 | Breton et al. .............. 427/383.1 |
| 2011/0114706 A1* | 5/2011 | Sasaoka et al. ............... 228/164 |

FOREIGN PATENT DOCUMENTS

| | | |
|---|---|---|
| JP | 2005-136399 (A) | 5/2005 |
| JP | 2005-203468 (A) | 7/2005 |
| JP | 2006-128161 (A) | 5/2006 |
| JP | 2007-208082 (A) | 8/2007 |
| JP | 2007-266396 | 10/2007 |
| WO | WO 2007/015330 (A1) | 2/2007 |
| WO | WO 2007/122925 (A1) | 11/2007 |

OTHER PUBLICATIONS

Japanese Notification of Reason for Refusal dated May 7, 2013, with English-language translation.

* cited by examiner

METHOD FOR MOUNTING LUMINESCENT DEVICE

BACKGROUND OF THE INVENTION

1. Field of the Invention

The present invention relates to a method for mounting a luminescent device of mounting a luminescent device on a mounted board by a flip chip method or a face up method.

2. Description of the Related Art

A light emitting diode chip (which is hereinafter abbreviated as an LED chip) using a gallium nitride compound semiconductor ($Al_{1-X-Y}In_XGa_YN$, $0 \leq X \leq 1$, $0 \leq Y \leq 1$, $0 \leq X+Y \leq 1$) capable of emitting blue light with a high light emission intensity is being subjected to practical use. Upon accumulating a gallium nitride compound semiconductor, epitaxial growth on an insulating growth substrate, such as a sapphire substrate, is often employed. Therefore, it is difficult to form an electrode on the side of the sapphire substrate, and both the anode and cathode are formed often on the side of the semiconductor layer.

An LED chip having the aforementioned structure is mounted on a mounting substrate mainly in one of the following two methods.

One of the methods is a flip chip mounting method, in which an LED chip is mounted on a mounting substrate with the semiconductor layer side thereof having the cathode and anode directed to the mounting substrate. In the mounting method, such a method for mounting an LED chip on a mounting substrate is subjected to practical use that: a solder layer is formed the anode and cathode of the LED chip; a solder paste is coated on the mounting substrate by screen printing; the LED chip is disposed on the mounting substrate with the semiconductor layer side thereof directed to the mounting substrate; and then the assembly is subjected to reflow (see, for example, JP-2007-266396).

The other mounting method is a face up mounting method, in which an LED chip is mounted on a mounting substrate with the growth substrate side thereof directed to the mounting substrate. In the mounting method, such a method for mounting an LED chip on a mounting substrate is subjected to practical use that: a metal having good wettability with solder, such as gold, is formed on the back surface of the growth substrate; a solder paste is coated on the mounting substrate by screen printing; the LED chip is disposed on the mounting substrate with the growth substrate side thereof directed to the mounting substrate; and then the assembly is subjected to reflow (see, for example, JP-2005-072148).

In the flip chip method and the face up method that use a solder paste, a flux, which is an organic activator for bonding, contained in the solder paste remains between the LED chip and the mounting substrate. The flux deteriorates the reliability of bonding between the LED chip and the mounting substrate, and therefore, the flux is necessarily removed by rinsing, which complicates the mounting process.

Furthermore, a solder paste that has been subjected to practical use contains only large microscopic solder particles having an average particle diameter of from 2 to 50 μm. Accordingly, the solder paste fails to pass favorably through a metallic mask upon screen printing, and precise transfer of the solder paste may not be expected. Consequently, the yield may be deteriorated in the flip chip method, in which failures due to short circuit between the anode and cathode are necessarily prevented.

SUMMARY OF THE INVENTION

The invention has been made in view of the problems associated with the conventional techniques, and an object of the invention is to simplify the mounting process of an LED chip on a mounting substrate, thereby providing a method for mounting a luminescent device, such as an LED chip, on a mounting substrate, capable of enhancing the bonding property between the LED chip and the mounting substrate.

In order to solve the above problem, this invention provides with a method for mounting a luminescent device having a mount layer on a substrate, comprising the steps of: coating a metallic nano-particle paste on the substrate; disposing the mount layer of the luminescent device on the metallic nano-particle paste; and heating the mount layer and the metallic nano-particle paste to form an alloy, thereby bonding the luminescent device and the substrate.

According to the method for bonding a luminescent device of the invention, the use of the metallic nano-particle paste having a small average particle diameter enables high-precise coating of the metallic nano-particle paste on a substrate.

Furthermore, the metallic nano-particles have a high activity upon bonding owing to the large specific surface area thereof. Accordingly, the metallic nano-particles can be bonded at a lower temperature as compared to microscopic particles, thereby bonding the luminescent device and the substrate without the use of a flux, which may remain as a residue.

DESCRIPTION OF THE PREFERRED EMBODIMENTS

Embodiments for carrying out the invention will be described below with reference to the attached drawings.

First Embodiment

Figure 1A:
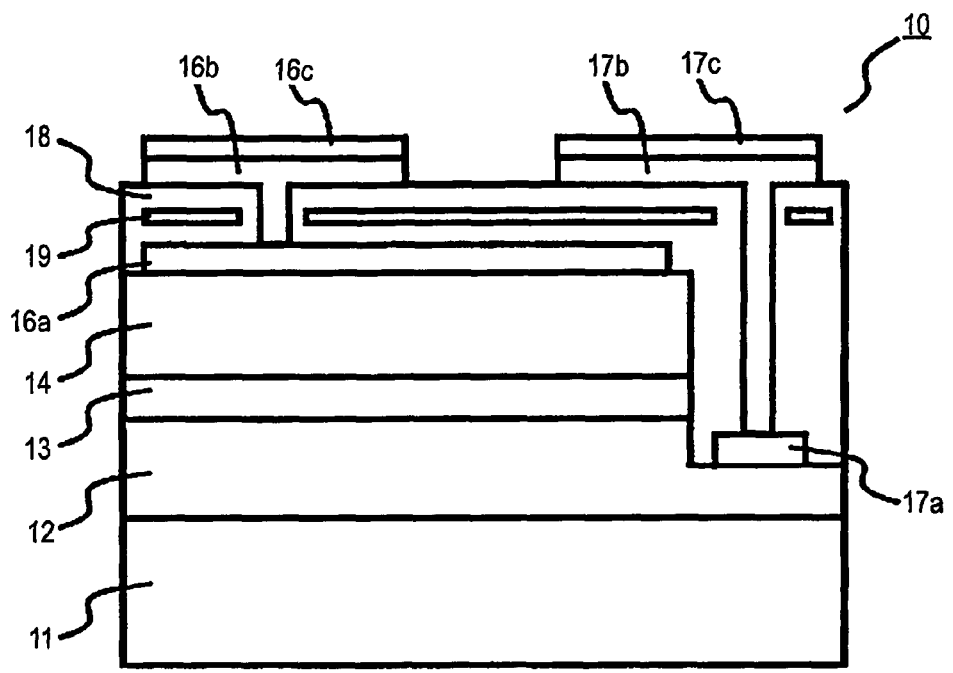
FIGS. 1A and 1B are each a cross sectional view showing an example of an LED chip used in a method for mounting an LED chip according to the first embodiment of the invention.
Figure 1B:
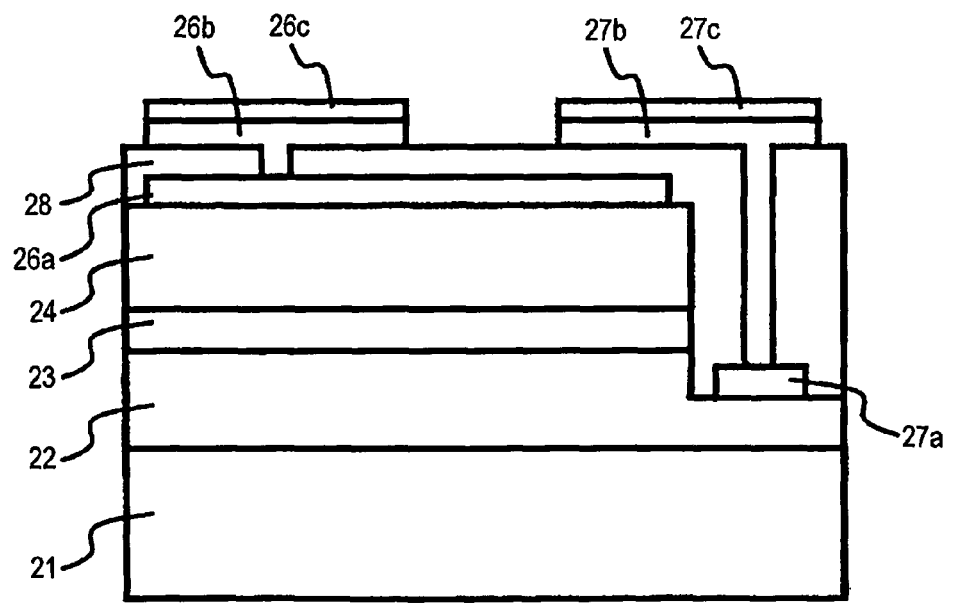

FIGS. 1A and 1B are each a cross sectional view showing an example of an LED chip used in a method for mounting an LED chip according to the first embodiment of the invention. The LED chip used in the embodiment is an LED chip to be mounted on a mounting substrate by the flip chip method.

An LED chip 10 shown in FIG. 1A will be described.

The LED chip 10 shown in FIG. 1A contains a growth substrate 11 formed of sapphire, a buffer layer (which is not shown in the figure) provided on the growth substrate 11, and a semiconductor laminated body formed of a gallium nitride compound semiconductor ($Al_{1-X-Y}In_XGa_YN$, $0 \leq X \leq 1$, $0 \leq Y \leq 1$, $0 \leq X+Y \leq 1$) containing an n-type layer 12, a luminescent layer 13 and a p-type layer 14 laminated in this order from the side of the growth substrate 11. A p-side ohmic electrode 16a having light transmissibility formed of ITO (indium tin oxide) forming ohmic bonding to the p-type layer 14 is provided on the surface of the p-type layer 14. The prescribed area of the LED chip 10 is subjected to dry etching that exposes from the p-type layer 14 to the n-type layer 12, and an n-side contact electrode 17a formed of V/Al is provided on the exposed bottom surface.

An insulating layer 18 having light transmissibility formed of $SiO_2$ is formed on the exposed surfaces of the semiconductor laminated body, the p-side ohmic electrode 16a and the n-side contact electrode 17a. The insulating layer 18 has openings formed to expose partially the p-side ohmic electrode 16a and the n-side contact electrode 17a, and a p-side barrier electrode 16b and an n-side barrier electrode 17b each formed of Ti/Ni are provided to be in contact with the p-side ohmic electrode 16a and the n-side contact electrode 17a, respectively, through the openings. A p-side mount electrode 16c and an n-side mount electrode 17c each formed of AuSn are formed on the surfaces of the p-side barrier electrode 16b and the n-side barrier electrode 17b, respectively.

The insulating layer 18 has a reflective layer 19 buried therein excluding the positions of the openings, and light emitted from the luminescent layer 13 passing through the p-side ohmic electrode 16a and the insulating layer 18 is reflected by the reflective layer 19 and then radiated outside the LED chip 10.

The layers of the semiconductor laminated body each may be formed, for example, by the metal organic chemical vapor deposition (MOCVD), the molecular beam epitaxy (MBE), the halide vapor phase epitaxy (HVPE) or the like.

The growth substrate is not limited to sapphire, and may be spinel, gallium nitride, silicon carbide, gallium oxide or the like instead.

The p-side ohmic electrode 16a, the n-side contact electrode 17a, the p-side barrier electrode 16b, the n-side barrier electrode 17b, the p-side mount electrode 16c and the n-side mount electrode 17c each may be formed by the sputtering method, the vacuum vapor deposition method or the like. The p-side ohmic electrode 16a is not limited to ITO, and may be other transparent electroconductive oxides, such as ICO (indium cerium oxide) and TNO (titanium niobium oxide), or a metallic thin film, such as Co/Au and Ni/Au, instead, and the n-side contact electrode 17a is not limited to V/Al, and may be Ti/Al or the like instead. The p-side barrier electrode 16b and the n-side barrier electrode 17b each are not limited to Ti/Ni, and may be a single substance, such as Ni, Ti and Pt, or a laminated structure containing a combination thereof instead. The p-side mount electrode 16c and the n-side mount electrode 17c each are not limited to AuSn, and may be other eutectic alloys, such as AuSb and AuGe, instead.

The insulating layer 18 may be formed by the plasma CVD method or the like. The insulating layer 18 is not limited to $SiO_2$, and may be a transparent layer, such as $Si_3N_4$, $TiO_2$ and $Al_2O_3$, instead.

The reflective layer 19 may be formed by patterning through photolithography into a desired shape in the course of the formation of the insulating layer 18, and further forming the insulating layer 18, thereby burying the reflective layer 19 inside the insulating layer 18.

An LED chip 20 shown in FIG. 1B will be described.

The LED chip 20 shown in FIG. 1B contains a growth substrate 21 formed of sapphire, a buffer layer (which is not shown in the figure) provided on the growth substrate 21, and a semiconductor laminated body formed of a gallium nitride compound semiconductor containing an n-type layer 22, a luminescent layer 23 and a p-type layer 24 laminated in this order from the side of the growth substrate 21. A p-side ohmic electrode 26a having a high reflectance to visible light formed of Rh forming ohmic bonding to the p-type layer 24 is provided on the surface of the p-type layer 24. The prescribed area of the LED chip 20 is subjected to dry etching that exposes from the p-type layer 24 to the n-type layer 22, and an n-side contact electrode 27a formed of V/Al is provided on the exposed bottom surface.

An insulating layer 28 formed of $SiO_2$ is formed on the exposed surfaces of the semiconductor laminated body, the p-side ohmic electrode 26a and the n-side contact electrode 27a. The insulating layer 28 has openings formed to expose partially the p-side ohmic electrode 26a and the n-side contact electrode 27a, and a p-side barrier electrode 26b and an n-side barrier electrode 27b each formed of Ti/Ni are provided to be in contact with the p-side ohmic electrode 26a and the n-side contact electrode 27a, respectively, through the openings. A p-side mount electrode 26c and an n-side mount electrode 27c each formed of AuSn are formed on the surfaces of the p-side barrier electrode 26b and the n-side barrier electrode 27b, respectively.

Light emitted from the luminescent layer 23 is reflected by the p-side ohmic electrode 16a and then radiated outside the LED chip 20.

The p-side ohmic electrode 26a is not limited to Rh, and may be Ag or an alloy containing Ag as a major component instead. The other elements of the LED chip 20 each may be substituted by the constitutional components described for the LED chip 10 shown in FIG. 1A.

The method for mounting an LED chip on a mounting substrate by the flip chip method will be described with reference to the LED chip 10 shown in FIG. 1A as an example.

The metallic nano-particle paste used for mounting the LED chip will be described. The nano-particles are formed of a noble metal, such as Au, Ag and Cu, which is chemically stable, and have an average particle diameter (D50) of from 1 to 80 nm, and preferably from 2 to 40 nm. The metallic nano-particles are formed into a paste by mixing with a volatile binder formed of an alcohol, such as tetradecanol.

The method for mounting an LED chip using the metallic nano-particle paste will be described. FIGS. 2A to 2D are cross sectional views showing an example of the method for mounting an LED chip according to the first embodiment of the invention.

Figure 2A:
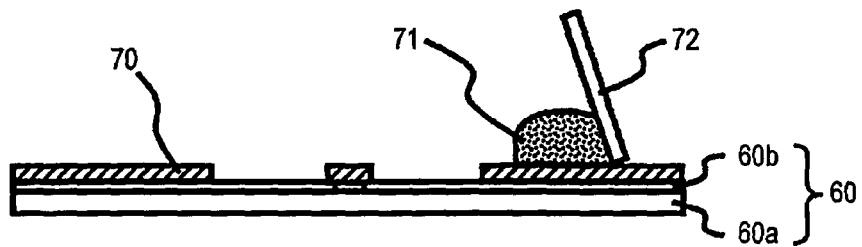
FIGS. 2A to 2D are cross sectional views showing an example of a method for mounting an LED chip according to the first embodiment of the invention.

As shown in FIG. 2A, firstly, on a surface of a mounting substrate 60 having a mother material 60a formed of ceramics or a glass-epoxy composite having formed thereon a wiring pattern 60b, a metallic mask 70 having through holes provided at positions where the mount electrodes of the LED chip 10 and the wiring pattern 60b are to be connected is disposed. A metallic nano-particle paste 71 containing Ag is disposed on one end of the metallic mask 70, and a squeegee 72 is moved from the one end of the metallic mask 70 to the other end thereof, thereby screen-printing the metallic nano-particle paste 71.

Figure 2B:
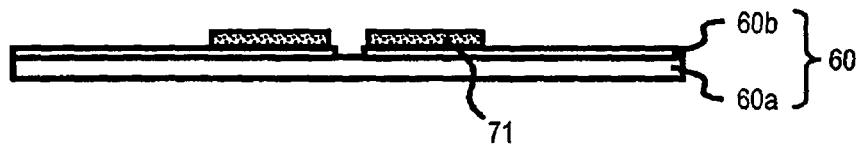

The LED chip 10 is then disposed in such a manner that the metallic nano-particle paste 71 thus coated as shown in FIG. 2B corresponds to the mount electrodes of the LED chip 10.

Figure 2C:
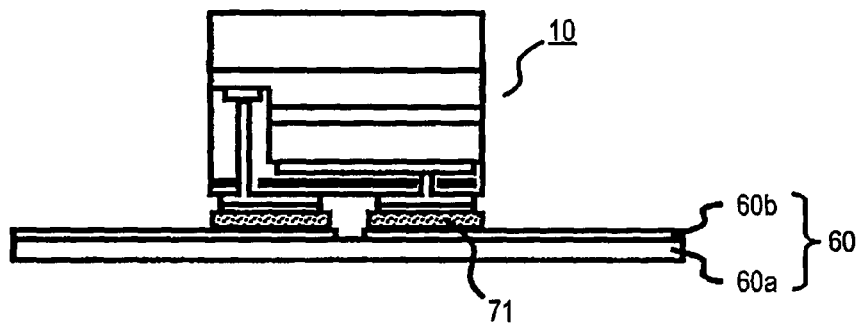
Figure 2D:
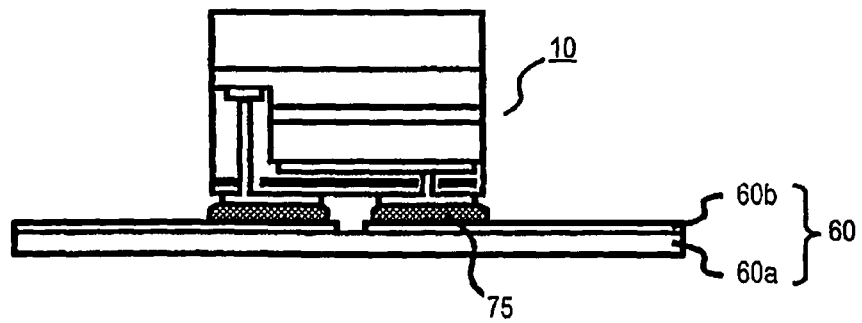

Thereafter, the assembly is heated to approximately 300° C. in a reflow furnace. Thus, the binder of the metallic nano-particle paste 71 as shown in FIG. 2C is evaporated, and AuSn constituting the mount electrodes is melted and formed into an alloy with Ag constituting the metallic nano-particle paste, thereby forming mount parts 75. According to the procedures, the LED chip 10 and the mounting substrate 60 are connected to each other to complete the mounting operation of the LED chip 10.

In the aforementioned method for mounting the LED chip 10, the use of the metallic nano-particle paste 71 having a small average particle diameter is enhanced in the passing through the metallic mask 70 upon screen-printing, thereby enabling precise transfer. Accordingly, failures due to short circuit between the anode and cathode are prevented to improve the yield.

Furthermore, the metallic nano-particles have a high activity upon bonding owing to the large specific surface area thereof. Accordingly, the metallic nano-particles can bond the mount electrodes of the LED chip 10 and the wiring pattern 60b of the mounting substrate 60 without the use of a flux. Consequently, no binder remains as a residue, and high bonding reliability is obtained.

Second Embodiment

Figure 3:
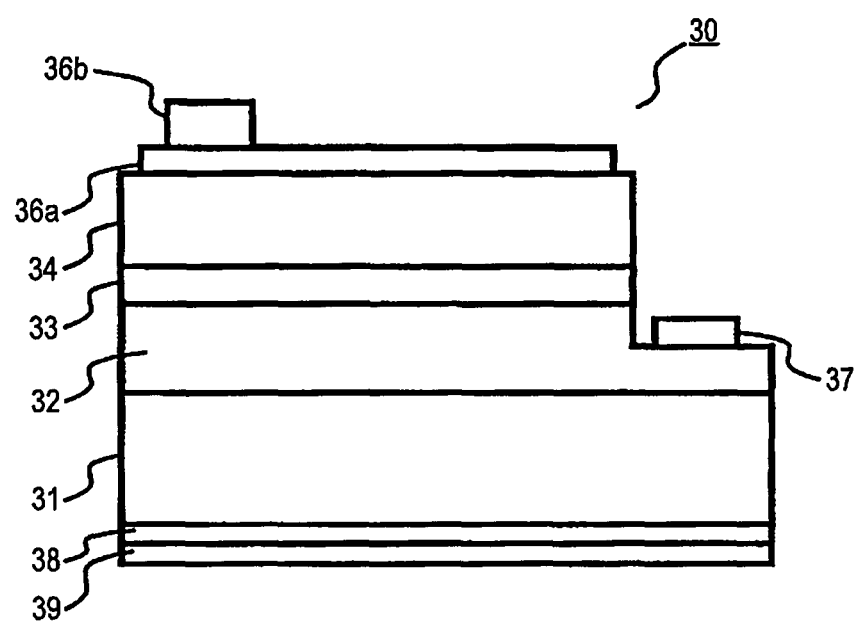
FIG. 3 is a cross sectional view showing an example of an LED chip used in a method for mounting an LED chip according to the second embodiment of the invention.

FIG. 3 is a cross sectional view showing an example of an LED chip used in a method for mounting an LED chip according to the second embodiment of the invention. The LED chip used in the embodiment is an LED chip to be mounted on a mounting substrate by the face up method.

An LED chip 30 shown in FIG. 3 will be described.

The LED chip 30 shown in FIG. 3 contains a growth substrate 31 formed of sapphire, a buffer layer (which is not shown in the figure) provided on the surface of the growth substrate 31, and a semiconductor laminated body formed of a gallium nitride compound semiconductor containing an n-type layer 32, a luminescent layer 33 and a p-type layer 34 laminated in this order from the side of the growth substrate 31. A p-side ohmic electrode 36a formed of ITO (indium tin oxide) forming ohmic bonding to the p-type layer 34 is provided on the surface of the p-type layer 34, and a p-side pad electrode 36b formed of Ni/Au is provided on a part of the surface of the p-side ohmic electrode 36a. The prescribed area of the LED chip 30 is subjected to dry etching that exposes from the p-type layer 34 to the n-type layer 32, and an n-side contact electrode 37 formed of V/Al is provided on the exposed bottom surface.

A barrier layer 38 formed of Ti/Ni and a mount layer 39 formed of AuSn are provided on the back surface of the sapphire substrate 31.

The barrier layer 38 is not limited to Ti/Ni, and may be a single substance, such as Ni, Ti and Pt, or a laminated structure containing a combination thereof instead. The mount layer 39 is not limited to AuSn, and may be other eutectic alloys, such as AuSb and AuGe, instead. The other elements of the LED chip 30 each may be substituted by the constitutional components described for the LED chip 10 shown in FIG. 1A.

The method for mounting an LED chip 30 using the metallic nano-particle paste by the face up method will be described. FIGS. 4A to 4D are cross sectional views showing an example of the method for mounting an LED chip according to the second embodiment of the invention.

Figure 4A:
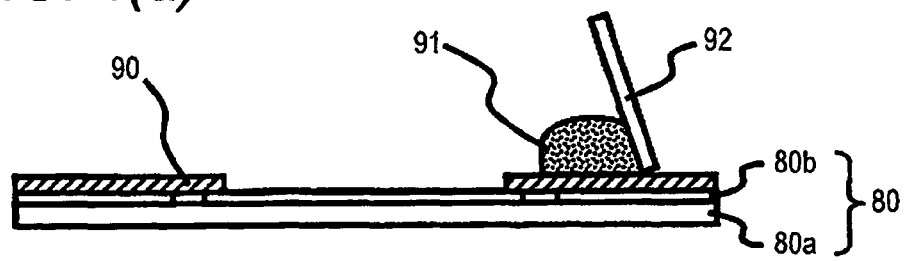
FIGS. 4A to 4D are cross sectional views showing an example of a method for mounting an LED chip according to the second embodiment of the invention.

As shown in FIG. 4A, firstly, on a surface of a mounting substrate 80 having a mother material 80a formed of ceramics or a glass-epoxy composite having formed thereon a wiring pattern 80b, a metallic mask 90 having through holes provided at positions where the mount electrodes of the LED chip 30 and the wiring pattern 30b are to be connected is disposed. A metallic nano-particle paste 91 containing Ag is disposed on one end of the metallic mask 90, and a squeegee 92 is moved from the one end of the metallic mask 90 to the other end thereof, thereby screen-printing the metallic nano-particle paste 91.

Figure 4B:
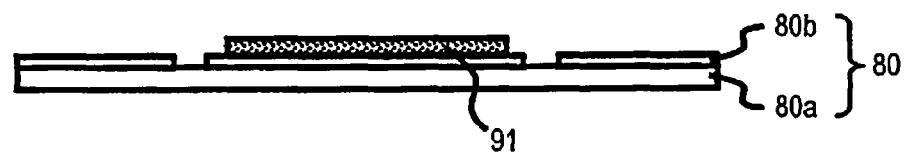

The LED chip 30 is then disposed in such a manner that the metallic nano-particle paste 91 thus coated as shown in FIG. 4B corresponds to the mount layer 39 of the LED chip 30.

Figure 4C:
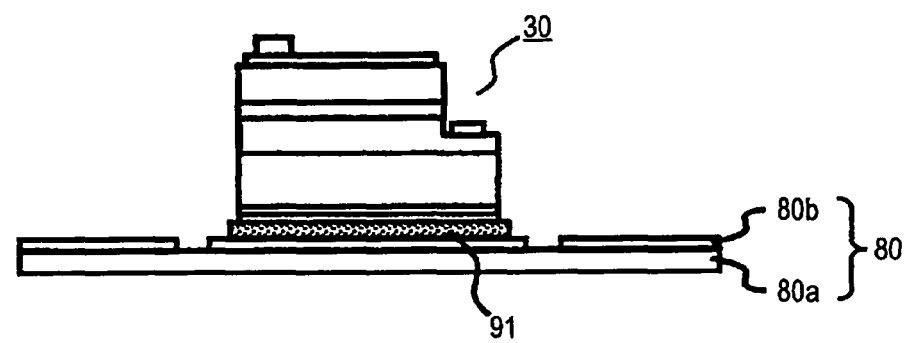
Figure 4D:
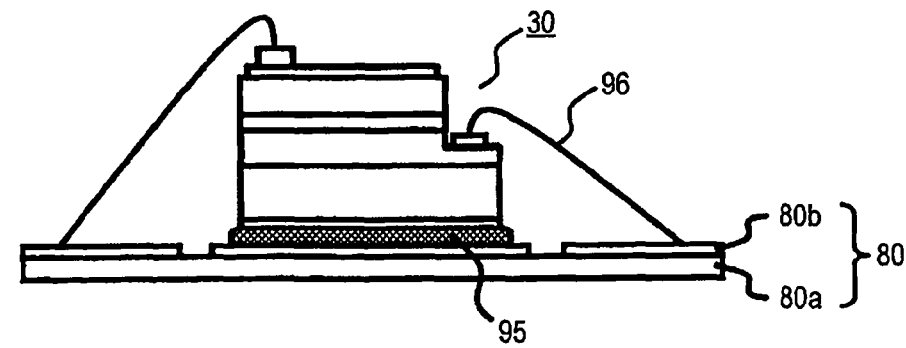

Thereafter, the assembly is heated to approximately 300° C. in a reflow furnace. Thus, the binder of the metallic nano-particle paste 91 as shown in FIG. 4C is evaporated, and AuSn constituting the mount layer 39 is melted and formed into an alloy with Ag constituting the metallic nano-particle paste, thereby forming mount parts 95. According to the procedures, the LED chip 30 and the mounting substrate 80 are connected to each other.

Finally, the p-side pad electrode 36b and the n-side contact electrode 37 of the LED chip 30 are connected to the wiring pattern 80b with gold wires, thereby completing the mounting of the LED chip 30 on the mounting substrate 80.

In the aforementioned method for mounting the LED chip 30, the metallic nano-particles have a high activity upon bonding owing to the large specific surface area thereof as similar to the first embodiment, and thus the mount layer 39 of the LED chip 30 can be bonded to the wiring pattern 80b of the mounting substrate 80 without the use of a flux. Consequently, no binder remains as a residue, and high bonding reliability is obtained.

Other Embodiments

In the aforementioned embodiments, LED chips formed of a gallium nitride compound semiconductor are described as examples, but the invention may be applied to LED chips formed of other compound semiconductors, such as an indium phosphorus compound semiconductor ($Al_{1-X-Y}Ga_X In_Y P$, $0 \leq X \leq 1$, $0 \leq Y \leq 1$, $0 \leq X+Y \leq 1$) and the like. In the aforementioned embodiments, LED chips are described as examples, but the invention may be applied to other luminescent devices, such as a laser diode and a light emitting thyristor. In the aforementioned embodiments, screen printing is employed as a method of coating the metallic nano-particle paste on the mounting substrate, but other coating methods, such as dispensing and stamping, may be employed.

The method for mounting a luminescent device according to the invention provides high reliability upon mounting on a mounting substrate, and thus is favorably employed for an LED lamp having an LED chip and COB (chip-on-board) having an LED chip.

What is claimed is:

1. A method for mounting a luminescent device having a mount layer on a substrate, the method comprising:
    coating a metallic nano-particle paste on the substrate by screen-printing, the metallic nano-particle paste including metallic nano-particles having an average particle diameter in a range from 2 nm to 40 nm and a binder;
    disposing the mount layer of the luminescent device on the metallic nano-particle paste; and
    heating the mount layer and the metallic nano-particle paste to form an alloy, thereby bonding the luminescent device and the substrate such that substantially only the metallic nano-particles from the metallic nano-particle paste and metal constituting the mount layer remain after forming the alloy, the alloy being formed from the metal constituting the mount layer melted into metal constituting the metallic nano-particle paste.

2. The method for mounting a luminescent device according to claim 1, wherein the binder comprises a volatile binder.

3. The method for mounting a luminescent device according to claim 2, wherein the metallic nano-particles comprise Au, Ag or Cu.

4. The method for mounting a luminescent device according to claim 3, wherein the mount layer comprises an eutectic alloy.

5. The method for mounting a luminescent device according to claim 4, wherein the mount layer functions as an electrode.

6. The method for mounting a luminescent device according to claim 1, wherein the binder comprises an alcohol.

7. The method for mounting a luminescent device according to claim 1, wherein the binder comprises tetradecanol.

8. The method for mounting a luminescent device according to claim 1, wherein the metallic nano-particles comprise Ag.

9. The method for mounting a luminescent device according to claim 1, wherein the heating comprises heating the metallic nano-particle paste to substantially 300° C.

10. The method for mounting a luminescent device according to claim 1, wherein the heating is performed with a flux disposed on the mount layer or the metallic nano-particle paste.

11. The method for mounting a luminescent device according to claim 1, wherein the metallic nano-particle paste consists of the metallic nano-particles and the volatile binder.

12. The method for mounting a luminescent device according to claim 1, wherein the metallic nano-particles comprise Au.

13. The method for mounting a luminescent device according to claim 1, wherein the metallic nano-particles comprise Cu.

* * * * *